United States Patent
Bellman et al.

(10) Patent No.: US 6,996,320 B2
(45) Date of Patent: Feb. 7, 2006

(54) USING DEUTERATED SOURCE GASES TO FABRICATE LOW LOSS GESION AND SION WAVEGUIDES

(75) Inventors: Robert Bellman, Painted Post, NY (US); Ikerionwu A. Akwani, Peoria, IL (US); Paul A. Sachenik, Corning, NY (US); Thomas P. Grandi, Corning, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 10/608,432

(22) Filed: Jun. 30, 2003

(65) Prior Publication Data

US 2004/0062504 A1    Apr. 1, 2004

Related U.S. Application Data

(63) Continuation-in-part of application No. 09/693,445, filed on Oct. 20, 2000, now abandoned.

(51) Int. Cl.
G02B 6/10    (2006.01)

(52) U.S. Cl. ...................... 385/129; 385/130
(58) Field of Classification Search ............... 385/129, 385/130, 131
See application file for complete search history.

(56) References Cited

U.S. PATENT DOCUMENTS

| | | | |
|---|---|---|---|
| 3,791,714 A * | 2/1974 | Maurer | 385/142 |
| 4,962,065 A | 10/1990 | Brown et al. | |
| 5,062,680 A | 11/1991 | Imamura et al. | |
| 5,264,724 A | 11/1993 | Brown et al. | |
| 5,343,544 A | 8/1994 | Boyd et al. | |
| 5,694,513 A | 12/1997 | Okaniwa | |
| 5,872,387 A * | 2/1999 | Lyding et al. | 257/607 |
| 5,972,765 A | 10/1999 | Clark et al. | |
| 5,979,188 A | 11/1999 | Ojha | |
| 6,077,791 A | 6/2000 | DeTar | |
| 6,229,949 B1 | 5/2001 | Ido et al. | |
| 6,306,563 B1 * | 10/2001 | Xu et al. | 430/321 |
| 6,341,190 B1 | 1/2002 | Summersgill et al. | |
| 6,393,185 B1 | 5/2002 | Deacon | |
| 6,499,318 B1 | 12/2002 | Lemaire et al. | |
| 6,678,452 B1 * | 1/2004 | Bloechl et al. | 385/129 |

FOREIGN PATENT DOCUMENTS

| | | |
|---|---|---|
| EP | 0 673 895 A2 | 9/1995 |
| JP | 09-078244 | 3/1997 |
| WO | WO 01/64594 A1 | 9/2001 |

OTHER PUBLICATIONS

Arnoldbik et al., "Dynamic Behavior of Hydrogen in Silicon Nitride and Oxynitride Films Made by Low-Pressure Chemical Vapor Deposition", The American Physical Society, Physical Review B, vol. 48, No. 8, Aug. 15, 1993, pp. 5444-5456.

(Continued)

*Primary Examiner*—Hae Moon Hyeon
(74) *Attorney, Agent, or Firm*—Foley & Lardner LLP

(57) ABSTRACT

The present invention provides a method of manufacturing optical devices which includes the steps of providing a substrate and forming at least one optical layer on the substrate. The optical layer is formed by a chemical vapor deposition (CVD) process which includes a deuterated source gas. The present invention also provides an optical device which includes a substrate and an optical layer including deuterium.

15 Claims, 3 Drawing Sheets

OTHER PUBLICATIONS

Bogatyrjov et al., "Passive Selective Filter for Flattening the Erbium-Doped Fibre Amplifier Gain Spectrum Based on a Feature of the Silicon Oxynitride Fibre Absorption Spectrum", Electronics Letters, vol. 31, No. 1, Jan. 5, 1995, pp. 61-62.

Bona et al., "Wavelength Division Multiplexed Add/Drop Ring Technology in Corporate Backbone Networks", Optical Engineering, vol. 37, No. 12, Dec. 1998, pp. 3218-3228.

Bosseboeuf and Bouchier, "Mechanisms of Reactive Ion-Beam Sputtering of Silicon Nitride in Presence of $^{15}$N- or D-Labeled Ammonia," J. Electrochem. Society, vol. 133, No. 4, Apr. 1986, pp. 810-816.

Cavallari et al., "Plasma Processing for Silicon Oxynitride Films", J. Electrochem. Soc., vol. 134, No. 5, May 1987, pp. 1265-1270.

Denisse et al., "Annealing of Plasma Silicon Oxynitride Films", J. Appl. Phys., vol. 60, No. 7, Oct. 1, 1986, pp 2543-2547.

German et al., "Silicon-oxynitride Layers for Optical Waveguide Applications," *Electrochemical Society Proceedings*, vol. 99-6.

Habraken et al., "Hydrogen in low-pressure chemical-vapor-deposited silicon (oxy)nitride films," *J. Appl. Phys.*, Jan. 15, 1986, vol. 59, No. 2.

Habraken et al., "Hydrogen in Low-Pressure Chemical-Vapor-Deposited Silicon (Oxy)Nitride Films", J. Appl. Phys. vol. 59, No. 2, Jan. 15, 1986, pp. 447-453.

He et al., "Hydrogen Behavior in PECVD Nitride by $SiH_4$ & $ND_3$ During RTA," Mat. Res. Soc. Symp. Proc., vol. 424, Apr. 8-12, 1996, San Francisco, CA pp. 109-114.

Hubner, "Strong Bragg Gratings Induced with 248 nm Light in Buried Silicon Exynitride Waveguides," XP-000987165.

Ohring, "The Materials Science of Thin Films", 1992, pp. 181-184.

Speakman et al., "Characterization of PECVD Deposited Silicon Oxynitride Thin Films", Vacuum, vol. 38, No. 3, 1988, pp. 183-188.

Spühler et al., "A Very Short Planar Silica Spot-Size Converter Using a Nonperiodic Segmented Waveguide", J. Lightwave Tech., vol. 16, No. 9, Sep. 1998, pp. 1680-1685.

* cited by examiner

USING DEUTERATED SOURCE GASES TO FABRICATE LOW LOSS GESION AND SION WAVEGUIDES

FIELD OF THE INVENTION

The present invention is directed generally to the manufacture of optical waveguides and more particularly to the use of deuterated source gasses to manufacture optical waveguides.

BACKGROUND OF THE INVENTION

Practical optical devices must be fabricated so as to direct the light energy. Commonly, this is achieved by creating a waveguide. In the waveguide, a cladding layer of lower refractive index (typically 1.44) directs light by internal reflectance to an optical core of higher refractive index (typically 1.45–1.5). Both the core and cladding layer can be made from many different materials. Common materials include glasses of $SiO_2$—$GeO_2$, $SiO_2$—$B_2O_3$—$P_2O_5$, $SiO_2$—$GeO_2$—$B_2O_3$—$P_2O_5$, $SiO_2$ and SiON. Silicon dioxide, silicon nitride and silicon oxynitride are materials which are particularly valued for their optical properties, in particular their high optical transparency and wide range of refractive indices (1.45–2.5). These materials are used in a host of optical devices. The devices include, for example, planar waveguides, arrayed waveguides (AWG), wavelength demultiplexers, power splitters, optical couplers, phasers, and variable optical attenuators (VOA).

Typically, chemical vapor deposition (CVD) is used to deposit layers of silicon dioxide, silicon nitride or silicon oxynitride. In the CVD process, the substrate is placed on a heated susceptor in a quartz reaction chamber and then the reactant gases are introduced into the chamber. Typically, the gasses react on the surface of the substrate and form a deposited layer. However, some reactions may also occur as the gasses flow into the chamber. The most common gasses for the deposition of silicon dioxide, silicon nitride and silicon oxynitride are silane ($SiH_4$), chlorinated silane ($Si$-$H_xCl_{4-x}$), nitrous oxide ($N_2O$), ammonia ($NH_3$) and nitrogen ($N_2$). These gases are inexpensive and can be purchased in great abundance.

Although the CVD process is the preferred process for depositing many of the materials used to manufacture optical devices, it is not without problems. The use of ammonia and silane in the production of silicon nitride and silicon oxynitride results in the incorporation of large amounts of hydrogen (up to 20 at % for silicon nitride) in the optical film.

The incorporated hydrogen generates significant optical losses at the 1550 nm optical communication band due to a strong overtone of the N—H bond. FIG. 1 illustrates the loss spectrum of conventionally processed silicon oxynitride, i.e., the loss over a range of wavelengths. The peak in loss is due to N—H absorption. In conventional manufacturing processes, the silicon oxynitride contains a significant amount of hydrogen. The figure clearly illustrates the deleterious effect of the overtone of the N—H bond. The center of the loss peak occurs at a wavelength of approximately 1510 nm. This is just 40 nm from 1550 nm, a preferred optical communications wavelength.

It is possible to remove much of the entrapped hydrogen with high temperature thermal annealing. However, the optical SiON film can blister and crack at the high temperature, rendering the device useless.

Therefore, it would be desirable to develop a method to manufacture optical devices which did not result in the incorporation of hydrogen in the optical SiON film and high losses at 1550 nm. Furthermore, it would be desirable to develop a process having the benefits of the speed and control of the conventional CVD process without resorting to a high temperature anneal to drive out the hydrogen.

SUMMARY OF THE INVENTION

The present invention provides a method of manufacturing optical devices comprising providing a substrate and forming at least one optical layer on the substrate by a CVD process including at least one deuterated source gas.

The present invention also provides an optical device comprising a substrate and an optical layer including deuterium.

BRIEF DESCRIPTION OF THE DRAWINGS

The foregoing and other features, aspects and advantages of the present invention will become apparent from the following description, appended claims and the exemplary embodiments shown in the drawings, which are briefly described below. It should be noted that unless otherwise specified like elements have the same reference numbers.

DETAILED DESCRIPTION OF THE PREFERRED EMBODIMENTS

Figure 3:
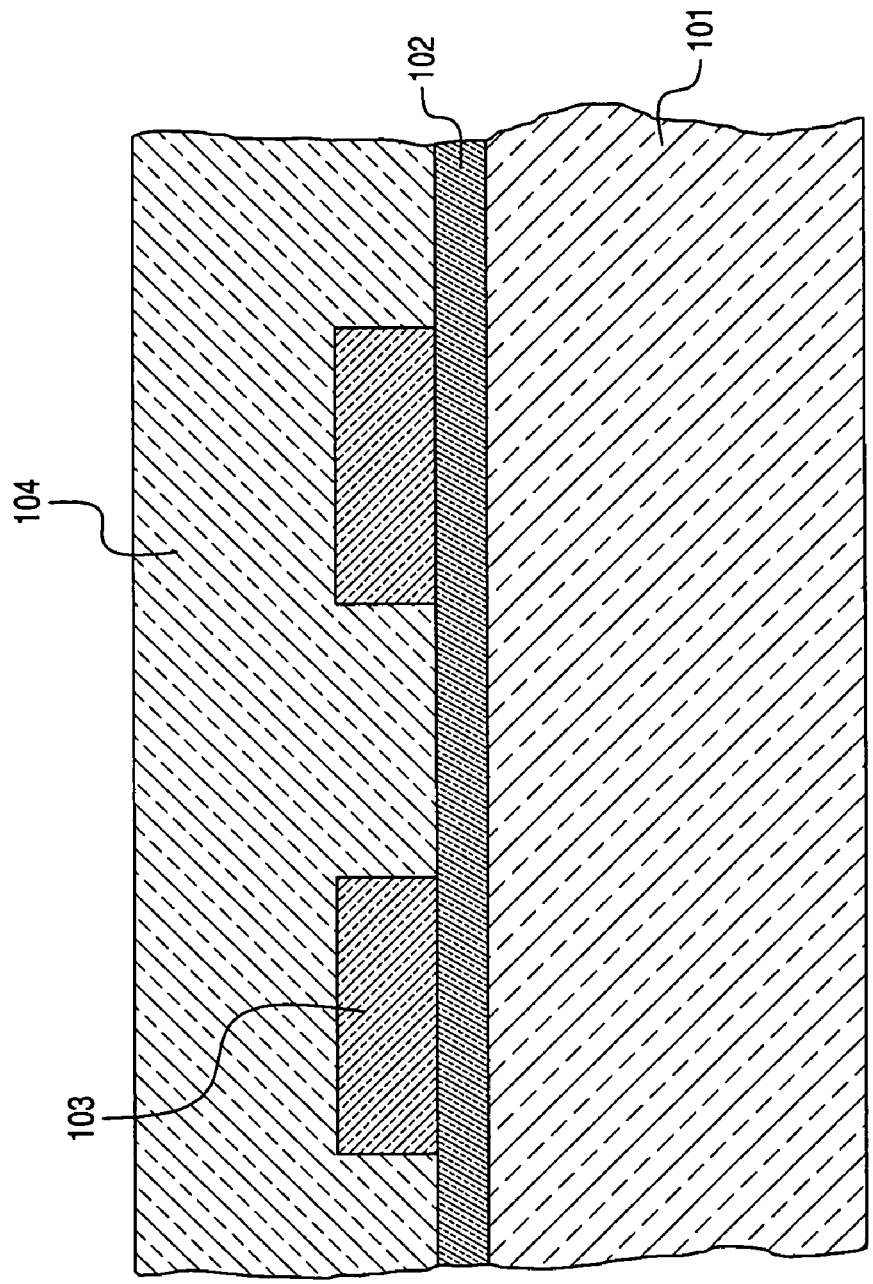
FIG. 3 is a cross section of an embodiment of the invention.

The present invention is directed to reducing the optical transmission loss in a waveguide by reducing the hydrogen content in the waveguide. FIG. 3 shows the cross section of a planar waveguide manufactured according to a preferred embodiment of the present invention. In this embodiment, an insulating buffer layer 102 is deposited on a substrate 101. A waveguide core 103 including deuterium is then deposited on the buffer layer 102 and the entire structure is coated with a cladding layer 104. As demonstrated below, the use of deuterated source gasses is effective in reducing the hydrogen content of the waveguide.

Silicon is the preferred material for the substrate 101. However, the substrate 101 may be made out of any material suitable for supporting the waveguide core 103. Example substrate materials include, but are not limited to, GaAs, InP, $SiO_2$, $Si_3N_4$, ceramics and plastics.

The preferred material for the buffer layer 102 is silicon oxynitride (SiON) or germanium doped silicon oxynitride (GeSiON). More preferably, the material for the buffer layer 102 is deuterated silicon oxynitride (SiON) or deuterated germanium doped silicon oxynitride (GeSiON). Additional materials suitable for the buffer layer include fluorine doped silica (FSG), phosphorous doped silica (PSG) and boron and phosphorous doped silica (BPSG). However, any suitable material can be used. For optimum results, the buffer layer 102 should have an index of refraction less than the index of refraction of the waveguide core 103. The buffer layer 102 may be omitted if the substrate is formed from a suitable material with a lower index of refraction than the core.

The preferred material for the cladding layer 104 is SiON or GeSiON. More preferably, the preferred material for the cladding layer 104 is deuterated SiON or deuterated GeSiON. However, any suitable material, such as plastics for example, can be used. For optimum results, the cladding layer 104 should have an index of refraction less than the index of refraction of the waveguide core 103.

The core 103 of the optical waveguide preferably comprises deuterated germanium doped silicon oxynitride ($Ge_w$-$Si_zO_xN_y$), where the sum of w, x, y and z is equal to 1. More preferably, the core 103 comprises deuterated silicon oxynitride ($Si_zO_xN_y$), where the sum of x, y and z is equal to 1. The deuterium replaces hydrogen and thereby reduces the hydrogen content in the waveguide. The index of refraction of the core is preferably between 1.44 and 2.2. More preferably, the index of refraction of the core is between 1.6 and 1.8. Furthermore, transmission losses due to attenuation are preferably less than 4.0 dB/cm in multimode slab waveguides and less than 2.0 dB/cm in single mode slab waveguides. More preferably, the transmission losses due to attenuation are less than 1.5 dB/cm in multimode slab waveguides and less than 0.2 dB/cm in single mode slab waveguides at 1550 nm.

By using deuterium source gasses in manufacturing the core 103, the hydrogen content of the core 103 is reduced and consequently the optical loss is reduced. This is shown, for example, by the Fourier transform infrared (FTIR) spectra of germanium doped silicon oxynitride (GeSiON) films are illustrated in FIG. 2.

Figure 1:
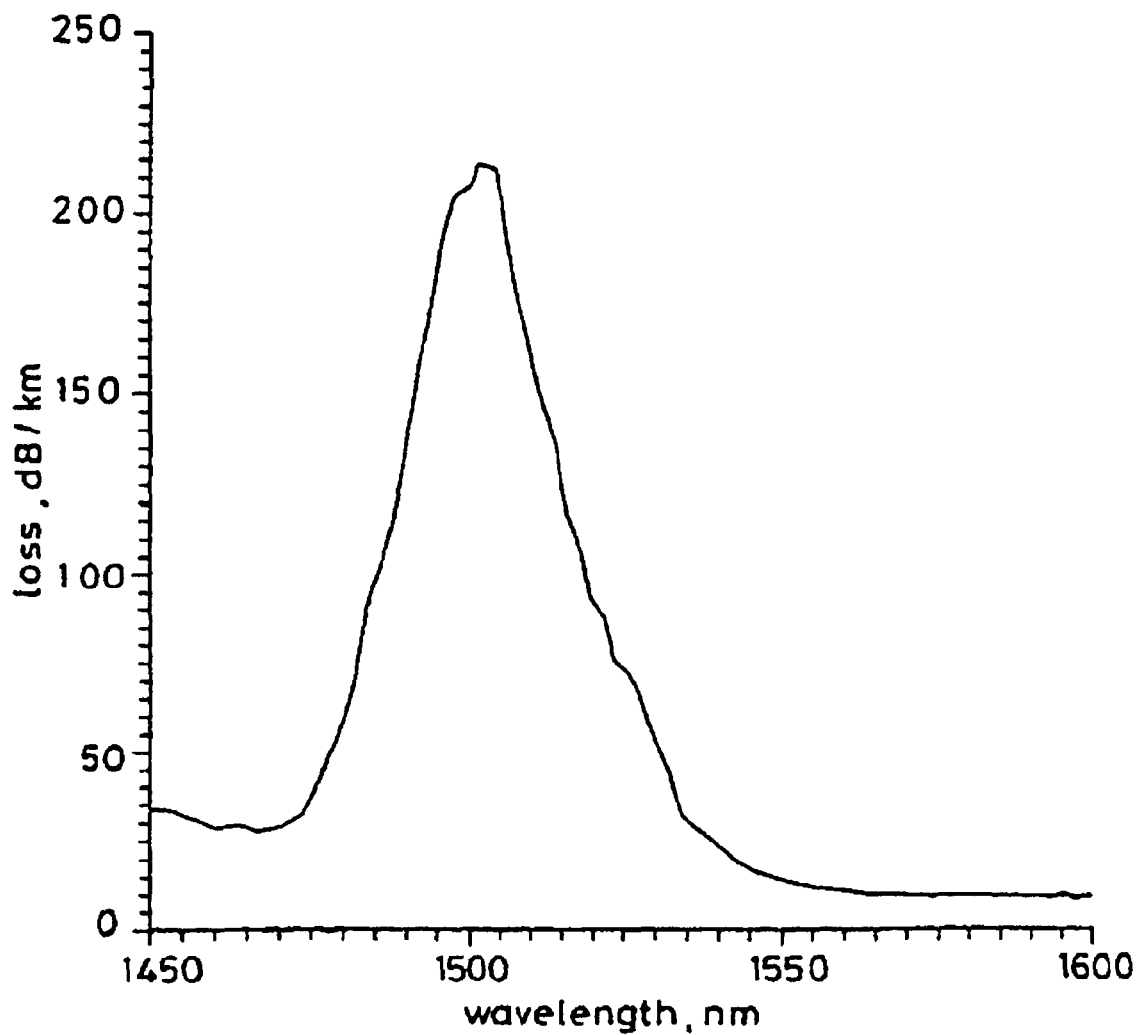
FIG. 1 is a plot of the loss spectrum of silicon oxynitride in the vicinity of the N—H absorption peak.
Figure 2:
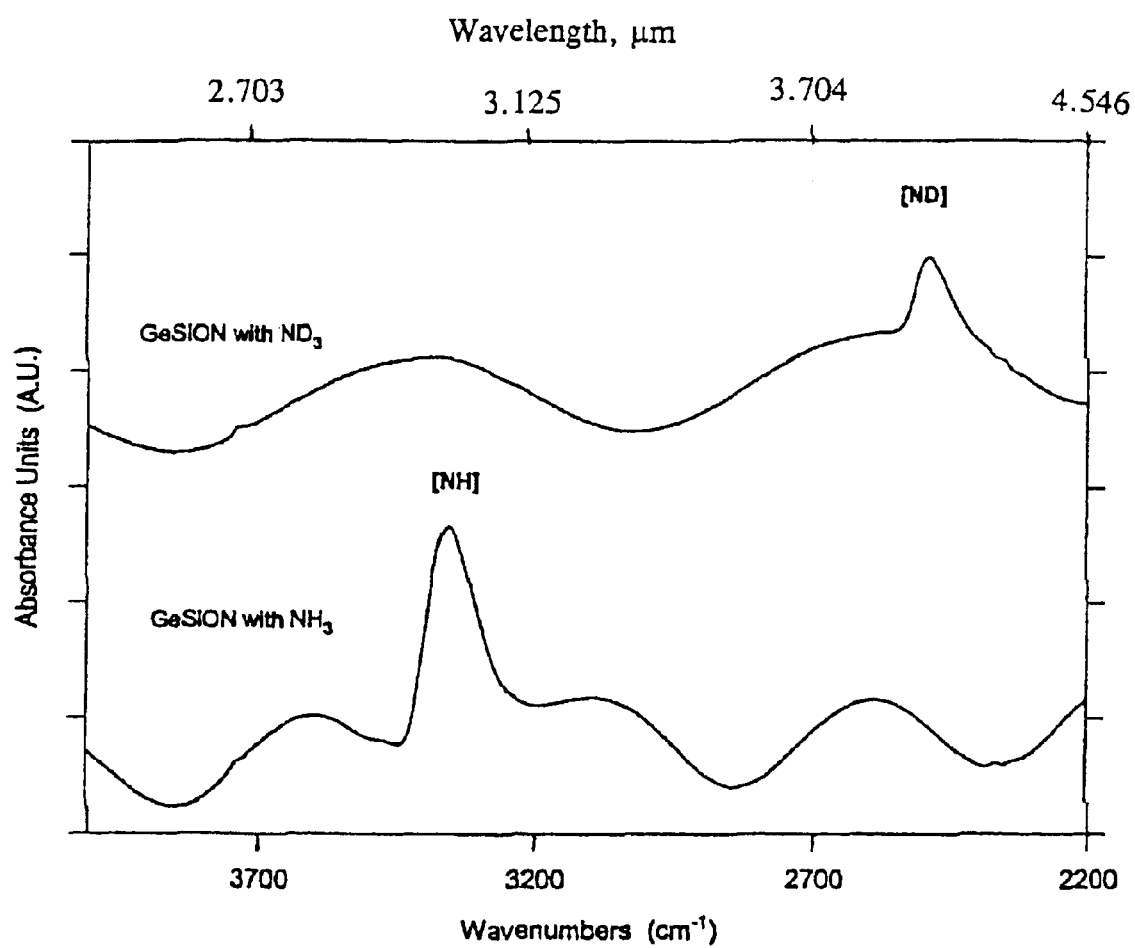
FIG. 2 is a plot of the FTIR spectra of GeSiON films deposited with $ND_3$ and with $NH_3$.

A film deposited with $NH_3$ is represented by the bottom spectrum in FIG. 2. This spectrum shows, like FIG. 1, that the NH stretch is at 3310 cm-1 (3.02 $\mu$m), which places the overtone absorption peak approximately at 1510 nm, which is near the communications wavelength. In contrast, the top spectrum in FIG. 2 represents a the germanium doped silicon oxynitride film formed with deuterated ammonia ($ND_3$) instead of regular ammonia ($NH_3$). As shown, the absorption peak is shifted from 3.02 $\mu$m to 4.08 $\mu$m. The overtone peak therefore shifts to 2004 nm, far from 1550 nm, the optical communications wavelength, by substituting $ND_3$ for the $NH_3$ source gas during deposition.

The use of deuterated silane, deuterated disilane and deuterated germane produce similar results. The use of any of these gases alone or in combination is beneficial because losses at 2004 nm due to the N—D bond are not significant for communications at 1550 nm.

The use of the deuterated core material has been described and illustrated by way of an optical waveguide. However, this is but one device which can be fabricated according to the present invention. Other devices which may also benefit from the material of the present invention include, but are not limited to, an optical waveguide, an arrayed waveguide, a wavelength demultiplexer, a power splitter, an optical coupler, a phaser, and a variable optical attenuator.

The core of the optical waveguide is preferably deposited by chemical vapor deposition (CVD). Low pressure CVD (LPCVD), atmospheric pressure CVD (APCVD) and plasma assisted CVD (PECVD) can be used. However, PECVD is the preferred method. One example of PECVD deposition is described below.

EXAMPLES

Deuterated silicon oxynitride and deuterated germanium doped silicon oxynitride films were deposited with an STS Multiflex PECVD system. This system is a parallel plate reactor where the precursor gasses enter through an array of holes in the top electrode (showerhead) and the sample rests on the bottom electrode. The bottom electrode is a non-rotating heated platen. The reaction gases included silane ($SiH_4$), germane ($GeH_4$), nitrous oxide ($N_2O$), deuterated ammonia ($ND_3$) and nitrogen ($N_2$). Regular ammonia ($NH_3$) was also available for making the comparative examples. The refractive index, optical propagation loss and film thickness were determined with a prism coupling system.

An initial series of thin germanium doped silicon oxynitride films were deposited with and without deuterated ammonia to evaluate the reduction in waveguide loss. These films were deposited on Si(100), $SiO_2$ and Corning 1737 glass substrates to form multimode slab waveguides. The deposition parameters for these films are in Table 1.

TABLE 1

| Recipe ID | EX. A | EX. B | EX. C | EX. D | EX. E | EX. F |
|---|---|---|---|---|---|---|
| Rf (380 kHz) Power (W) | 400 | 400 | 400 | 400 | 400 | 400 |
| Pressure (mtorr) | 500 | 400 | 400 | 400 | 500 | 400 |
| Substrate Temperature (C.) | 350 | 350 | 350 | 350 | 350 | 350 |
| Showerhead Temperature (C.) | 225 | 225 | 225 | 225 | 225 | 225 |
| 5% $SiH_4$/Ar (sccm) | 200 | 100 | 100 | 200 | 200 | 100 |
| 2% $GeH_4$/Ar (sccm) | 250 | 400 | 400 | 250 | 250 | 400 |
| $N_2O$ (sccm) | 200 | 117 | 117 | 200 | 200 | 117 |
| $ND_3$ (sccm) | 200 | 50 | 100 | 300 | 0 | 0 |
| $NH_3$ (sccm) | 0 | 0 | 0 | 0 | 200 | 50 |
| $N_2$ (Sccm) | 1600 | 2000 | 2000 | 1600 | 1600 | 2000 |
| Deposition Time (min) | 40 | 40 | 40 | 40 | 40 | 40 |

Films from the initial round of GeSiON films with $ND_3$ were smooth and uniform with a slight green coloration as deposited. The film thicknesses and indexes were measured by prism coupling at two wavelengths, 652 nm and 1550 nm. The prism coupling measurements demonstrate that the thickness and indexes are very near that of films deposited with $NH_3$. Table 2 summarizes the thickness and index measurements.

TABLE 2

|  | n(632) nm | t(632) μm | N(1550) nm | t(1550) μm | t(ave) μm |
|---|---|---|---|---|---|
| EX. A | 1.6732 | 3.6012 | 1.6482 | 3.5616 | 3.5814 |
| EX. B | 1.7398 | 3.3384 | 1.7105 | 3.3607 | 3.3496 |
| EX. C | 1.8308 | 3.2623 | 1.7897 | 3.2462 | 3.2543 |
| EX. D | 1.7073 | 3.2744 | 1.6819 | 3.1631 | 3.2188 |

Table 3 is a comparison between attenuation measurements on multimode slab germanium doped silicon oxynitride waveguides deposited with $ND_3$ (Examples A to D) and multimode slab germanium doped silicon oxynitride waveguides deposited with $NH_3$ (Examples E and F).

TABLE 3

| Sample | Loss in dB/cm |
|---|---|
| EX. A | 2.5 |
| EX. B | 2.1 |
| EX. C | 3.5 |
| EX. D | 1.3 |
| EX. E | 8 |
| EX. F | 11 |

The optical propagation loss in multimode slab waveguides ranged from 1.3 to 3.5 dB/cm for films deposited with $ND_3$. By comparison, the propagation loss in comparable films deposited with $NH_3$ ranged from 8–11 dB/cm.

Table 4 summarizes and compares the compositions of the GeSiON films deposited with $ND_3$ with those deposited with $NH_3$.

TABLE 4

| | | Atomic Fraction | | | | | |
|---|---|---|---|---|---|---|---|
| Sample | | Si | Ge | O | N | H | D |
| EX. E | $NH_3$ | 0.184 | 0.087 | 0.295 | 0.250 | 0.184 | — |
| EX. A | $ND_3$ | 0.153 | 0.104 | 0.317 | 0.190 | 0.086 | 0.150 |
| EX. F | $NH_3$ | 0.121 | 0.196 | 0.425 | 0.149 | 0.109 | — |
| EX. A | $ND_3$ | .93 | 0.228 | 0.377 | 0.122 | 0.090 | 0.090 |

The samples prepared with $ND_3$ have significantly less hydrogen incorporation than the samples prepared with $NH_3$. Samples deposited with $ND_3$ show lower nitrogen levels. This is believed to result from a lower $ND_3$ flow than $NH_3$ because the flow controllers were not re-normalized.

A second series of thin germanium doped silicon oxynitride films were deposited with deuterated ammonia to evaluate the reduction in waveguide loss. In this series, two samples were deposited with a waveguide core over a 13–15 μm cladding layer on a silicon wafer to form a single mode waveguide. The deposition parameters are summarized in Table 5

TABLE 5

| | G | | H | | I | | J | |
|---|---|---|---|---|---|---|---|---|
| Recipe ID | Underclad | Core | Underclad | Core | Underclad | Core | Underclad | Core |
| Rf (380 kHz) Power (W) | 400 | 400 | 400 | 400 | 400 | 400 | 400 | 400 |
| Pressure (mtorr) | 400 | 400 | 400 | 400 | 400 | 400 | 400 | 400 |
| Substrate Temperature (C.) | 350 | 350 | 350 | 350 | 350 | 350 | 350 | 350 |
| Showerhead Temperature (C.) | 225 | 225 | 225 | 225 | 225 | 225 | 225 | 225 |
| 5% $SiH_4$/Ar (sccm) | 100 | 100 | 100 | 100 | 100 | 100 | 100 | 100 |
| 2% $GeH_4$/Ar (sccm) | 400 | 400 | 400 | 400 | 400 | 400 | 400 | 400 |
| $N_2O$ (sccm) | 125 | 117 | 125 | 117 | 125 | 117 | 125 | 117 |
| $ND_3$ (sccm) | 50 | 50 | 50 | 50 | 0 | 0 | 0 | 0 |
| $NH_3$ (sccm) | 0 | 0 | 0 | 0 | 50 | 50 | 50 | 50 |
| $N_2$ (Sccm) | 2000 | 2000 | 2000 | 2000 | 2000 | 2000 | 2000 | 2000 |
| Deposition Time (min) | 135 | 40 | 160 | 60 | 135 | 40 | 160 | 60 |

As in the initial series of films, the film thicknesses and indexes were measured by prism coupling at two wavelengths, 652 nm and 1550 nm. The prism coupling measurements demonstrate that the thickness and indexes are very near that of films deposited with $NH_3$. Table 2 summarizes the thickness and index measurements.

TABLE 6

| | | n (632) nm | t (632) μm |
|---|---|---|---|
| EX. G | Clad | 1.6875 | 13.4047 |
| | Core | 1.6997 | 6.5692 |
| EX. H | Clad | 1.6916 | 16.0999 |
| | Core | 1.7007 | 6.6219 |

Table 7 is a comparison between attenuation measurements on single mode slab germanium doped silicon oxynitride waveguides deposited with $ND_3$ (Examples G and H) and single mode slab germanium doped silicon oxynitride waveguides deposited with $NH_3$ (Examples I and J).

TABLE 7

| Sample | loss in dB/cm |
|---|---|
| EX. G | 1.3 |
| EX. H | 2.0 |
| EX. I | 7 |
| EX. J | 7 |

The optical propagation loss in single mode waveguides ranged from 1.3 to 2.0 dB/cm for films deposited with $ND_3$. By comparison, the propagation loss in comparable films deposited with $NH_3$ was 7 dB/cm.

A third series of deuterated thin film single mode waveguides were manufactured to study the effect of various GeSiON/SiON core/cladding configurations. In this series, three combinations were tested. These include, GeSiON core/clad, SiON core/clad and SiON core on GeSiON clad. The deposition parameters are summarized in Table 8.

TABLE 8

| Recipe ID | K | | L | | M | | N | |
|---|---|---|---|---|---|---|---|---|
| | Underclad | Core | Underclad | Core | Underclad | Core | Underclad | Core |
| Rf (380 kHz) Power (W) | 400 | 400 | 400 | 400 | 400 | 400 | 400 | 400 |
| Pressure (mtorr) | 350 | 350 | 350 | 350 | 350 | 350 | 350 | 350 |
| Substrate Temperature (C.) | 350 | 350 | 350 | 350 | 350 | 350 | 350 | 350 |
| Showerhead Temperature (C.) | 225 | 225 | 225 | 225 | 225 | 225 | 225 | 225 |
| 5% $SiH_4$/Ar (sccm) | 100 | 100 | 260 | 260 | 100 | 260 | 100 | 0 |
| 2% $GeH_4$/Ar (sccm) | 400 | 400 | 0 | 0 | 400 | 0 | 400 | 0 |
| 5% $SiD_4$/Ar (sccm) | 0 | 0 | 0 | 0 | 0 | 0 | 0 | 260 |
| $N_2O$ (sccm) | 125 | 120 | 35 | 35 | 126 | 35 | 126 | 33 |
| $ND_3$ (sccm) | 45 | 45 | 60 | 60 | 45 | 75 | 45 | 100 |
| $N_2$ (Sccm) | 3500 | 3500 | 3500 | 3500 | 3500 | 3500 | 3500 | 3500 |
| Deposition Time (min) | 160 | 60 | 205 | 55 | 165 | 57 | 165 | 90 |

In the third series, both the propagation loss and the wafer warpage was measured. The result of these experiments are summarized in Table 9.

TABLE 9

| Sample | Loss in dB/cm | Wafer warpage TIR ($\mu$m) |
|---|---|---|
| EX. K | 1.12 | 20.5 |
| EX. L | <0.2 | 217.8 |
| EX. M | 0.38 | 8.0 |
| EX. N | <0.2 | 121 |

The first sample (Example K), a GeSiON core on a GeSiON cladding layer, exhibits approximately a 1 dB/cm propagation loss with low wafer warpage. The second sample (Example L), a SiON core on a SiON cladding layer, had a propagation loss near the 0.2 dB/cm detection limit of the test equipment. However, the wafer warpage is very high. Depositing a SiON core on a GeSiON cladding, the third sample (Example M), resulted in a slightly higher loss of 0.38 dB/cm while reducing wafer warpage. Depositing a SiON core on a GeSiON cladding using deuterated ammonia and deuterated silane, the fourth sample (Example N), resulted in propagation losses below 0.2 dB/cm. However, wafer warpage increased significantly.

The foregoing description of the invention has been presented for purposes of illustration and description. It is not intended to be exhaustive or to limit the invention to the precise form disclosed, and modifications and variations are possible in light of the above teachings or may be acquired from practice of the invention. The drawings and description were chosen in order to explain the principles of the invention and its practical application. It is intended that the scope of the invention be defined by the claims appended hereto, and their equivalents.

The foregoing description of the invention has been presented for purposes of illustration and description. It is not intended to be exhaustive or to limit the invention to the precise form disclosed, and modifications and variations are possible in light of the above teachings or may be acquired from practice of the invention. The drawings and description were chosen in order to explain the principles of the invention and its practical application. It is intended that the scope of the invention be defined by the claims appended hereto, and their equivalents.

What is claimed is:

1. An optical device comprising:
a substrate; and
an inorganic optical layer comprising deuterium,
wherein the inorganic optical layer comprises deuterated silicon oxynitride and the inorganic optical layer exhibits propagation losses below 4 dB/cm.

2. The optical device of claim 1, wherein the optical layer comprises deuterated germanium doped silicon oxynitride.

3. The optical device of claim 1, wherein the device further comprises a cladding layer.

4. The optical device of claim 3, wherein the cladding layer comprises silicon oxynitride.

5. The optical device of claim 3, wherein the cladding layer comprises deuterated germanium doped silicon oxynitride.

6. The optical device of claim 5, wherein the device further comprises a buffer layer.

7. The optical device of claim 6, wherein the buffer layer comprises deuterated germanium doped silicon oxynitride.

8. The optical device of claim 6, wherein the buffer layer is selected from the group consisting of FSG, PSG and BPSG.

9. The optical device of claim 1, wherein the wavelength of an overtone in the patterned optical layer is about 2004 nm.

10. The optical device of claim 1, wherein said optical layer exhibits propagation losses below 0.2 dB/cm.

11. The optical device of claim 5, wherein said optical layer exhibits propagation losses below 0.2 dB/cm.

12. The optical device of claim 5, wherein said optical layer exhibits an index of refraction between 1.45 and 2.2.

13. The optical device of claim 5, wherein said optical layer exhibits an index of refraction between 1.6 and 1.8.

14. The optical device of claim 1, wherein said optical device is chosen from the group consisting of an optical waveguide, an arrayed waveguide, a wavelength demultiplexer, a power splitter, an optical coupler, a phaser, and a variable optical attenuator.

15. An optical device comprising:
a substrate;
an inorganic optical layer comprising deuterium; and
a silicon oxynitride buffer layer between the substrate and the optical layer,
wherein the inorganic optical layer comprises deuterated silicon oxynitride and the inorganic optical layer exhibits propagation losses below 4 dB/cm.

* * * * *